United States Patent [19]

Kepler et al.

[11] Patent Number: 6,074,927
[45] Date of Patent: Jun. 13, 2000

[54] SHALLOW TRENCH ISOLATION FORMATION WITH TRENCH WALL SPACER

[75] Inventors: Nick Kepler, Saratoga, Calif.; Basab Bandyopadhyay, Austin, Tex.; Olov Karlsson; Larry Wang, both of San Jose, Calif.; Effiong Ibok, Sunnyvale, Calif.; Christopher F. Lyons, Fremont, Calif.

[73] Assignee: Advanced Micro Devices, Inc., Sunnyvale, Calif.

[21] Appl. No.: 09/087,662

[22] Filed: Jun. 1, 1998

[51] Int. Cl.[7] ..................................... H01L 21/76
[52] U.S. Cl. .......................... 438/400; 438/424; 438/445
[58] Field of Search ................................... 438/400, 424, 438/445

[56] References Cited

U.S. PATENT DOCUMENTS 5,399,520   3/1995   Jang .
5,930,645   7/1999   Lyons et al. .

Primary Examiner—John F. Niebling
Assistant Examiner—Josetta Jones

[57] ABSTRACT

A shallow trench isolation structure is formed which enables the growth of a high quality gate oxide at the trench edges and protects the field oxide from gouging during post-gate processing, such as during the local interconnect etch, thereby allowing the formation of high-quality implanted junctions. Embodiments include forming a photoresist mask directly on a pad oxide layer which, in turn, is formed on a main surface of a semiconductor substrate or an epitaxial layer on a semiconductor substrate. After masking, the substrate is etched to form a trench, an oxide liner is grown in the trench surface, and a polish stop layer is deposited in the trench on the oxide liner and on the pad oxide layer. The polish stop layer is then masked to the trench edges, and the polish stop in the trench is anisotropically etched, to remove the polish stop at the bottom of the trenches leaving a portion overlying the side surfaces and edges of the trench on the oxide liner. The trench is then filled with an insulating material, the insulating material is planarized, and the polish stop over the pad oxide layer is removed by anisotropic etching. Thus, the oxide liner is allowed to grow on the trench edges without the restraint of a polish stop, resulting in a thick, rounded oxide on the trench edges. The portion of the polish stop remaining in the trench and on the oxide liner at the trench edges serves as a protective spacer, protecting the field oxide from erosion during subsequent processing steps.

17 Claims, 5 Drawing Sheets

SHALLOW TRENCH ISOLATION FORMATION WITH TRENCH WALL SPACER

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and a thin oxide liner is thermally grown on the trench walls. The trench is then refilled with a thick insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor. The quality and thickness of the gate oxide are crucial to the performance of the finished device. After implantation of the substrate is completed, titanium silicide is formed on the gates and source/drain regions to reduce sheet resistance in these areas. Silicide formation is followed by local interconnect (LI) formation, comprising depositing, masking and etching a dielectric layer, then filling in the etched areas with a metal conductor to provide local connections between gates and active areas.

A typical method of trench formation comprises initially growing a pad oxide layer on the substrate, and depositing a nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to, inter alia, control the silicon-silicon dioxide interface quality and to round the trench corner. The trench is then refilled with an insulating material (or "trench fill"), such as silicon dioxide derived from tetraethyl orthosilicate (TEOS). The surface is then planarized, as by chemical-mechanical polishing (CMP) using the nitride layer as a polish stop. In subsequent operations, the nitride and pad oxide are stripped off, and a gate oxide layer is grown on the exposed silicon of the substrate.

Disadvantageously, the gate oxide layer typically does not grow uniformly. Rather, it tends to be thinner at the trench edges, because the gate oxide growth rate is smaller there due to the sharpness of the trench edges and the different crystallographic orientation of the silicon at the trench edges. The thinness of the gate oxide and the sharpness of the trench edges increase the electric field strength at the trench edges, decreasing device reliability.

Furthermore, during post-gate processing, such as during the LI dielectric etching step, the field oxide at the trench edge (i.e., the interface of the substrate and the oxide) is eroded, or "gouged" by the etchant. FIG. 1A shows the substrate 1, field oxide 2, and silicide layer 4. Oxide loss at the trench edge is problematic, particularly with respect to impurities implanted close to the upper surface of the substrate 1 to form junctions. The depth d of such a junction 3 is referenced to the upper surface 1a of the substrate 1 when the junction 3 is formed. The junction 3 follows the contour of the upper surface 1a of the substrate, so that the upper surface 1a and the junction 3 are a constant distance d apart.

Thus, any subsequent oxide loss will reduce the distance between a portion of the junction 3 and the upper surface 1a of the substrate 1. This is illustrated in FIG. 1B, where the original oxide surface $2_0$ has been eroded as shown by the arrows to a lower level $2_i$. As a result, portion 3a of the junction 3 is closer to the upper surface of the substrate (i.e., at depth d') than it was prior to the unintended oxide removal. This unwanted oxide removal and resultant proximity of the junction to the surface 1b causes problems, such as junction leakage and junction short circuits when metal LI layer 5 is formed over the field oxide 2, thereby adversely affecting device performance.

There exists a continuing need for shallow trench isolation methodology wherein the resulting gate oxide layer at the trench edges exhibits high reliability, and wherein oxide loss at the edges of isolation trenches during post gate processing is minimized, thereby reducing junction leakage and short circuits.

SUMMARY OF THE INVENTION

An object of the present invention is a method of manufacturing a semiconductor device having a shallow trench isolation region, a gate oxide with high integrity, and implanted junctions of high quality.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; providing a first mask having an opening on the pad oxide layer; etching to remove portions of the underlying pad oxide layer and to form the trench having a bottom and side surfaces intersecting the main surface at edges; removing the first mask; forming an oxide layer lining the trench, on the edges, and in contact with the pad oxide layer; depositing a polish stop layer on the oxide liner and the pad oxide layer; providing a second mask on the polish stop layer, the second mask extending over the polish stop layer overlying the trench edges and having an opening exposing the polish stop on the bottom of the trench; and anisotropically etching to remove a portion of the polish stop layer on the bottom of the trench, leaving portions of the polish stop layer on the side surfaces and edges of the trench to serve as protective spacers.

Another aspect of the present invention is a method of manufacturing an integrated circuit on a semiconductor substrate, comprising: forming a silicon oxide pad layer on a main surface of the substrate or an epitaxial layer formed on the substrate; providing a first photoresist mask having an opening on the silicon oxide pad layer; etching to remove portions of the underlying silicon oxide pad layer and to form the trench having a bottom and side surfaces intersecting the main surface at edges; removing the first mask; thermally growing a thin silicon oxide layer lining the trench, on the edges and in contact with the silicon oxide pad layer by heating to a temperature of at least about 1000° C., whereby the silicon oxide liner grown on the trench edges is rounded; depositing a silicon nitride polish stop layer on the silicon oxide liner and the silicon oxide pad layer; providing a second photoresist mask on the silicon nitride polish stop layer, the second mask extending over the silicon nitride polish stop layer overlying the trench edges and having an opening exposing the silicon nitride polish stop layer on the bottom of the trench; anisotropically etching to remove a portion of the silicon nitride polish stop layer on the bottom of the trench, leaving portions of the silicon nitride polish stop layer on the side surfaces and edges of the trench to serve as protective spacers; removing the second mask; depositing an insulating material to fill the trench and cover the silicon nitride polish stop layer, the insulating material comprising silicon dioxide derived from tetraethyl orthosilicate (TEOS) by low pressure chemical vapor deposition (LPCVD), silicon dioxide derived from silane by LPCVD, or a high density plasma oxide; planarizing by chemical-mechanical polishing such that an upper surface of the insulating material is substantially flush with an upper surface of the silicon nitride polish stop layer; and anisotropically etching the silicon nitride polish stop layer.

Still another aspect of the invention is a semiconductor device comprising: a substrate or epitaxial layer formed in the substrate; a trench, formed in the substrate or epitaxial layer, having side surfaces intersecting a main surface of the substrate or epitaxial layer at edges; a thermally grown oxide liner in the trench and on the edges, the oxide liner being rounded at the edges; a protective spacer formed on the oxide liner on the side surfaces and edges, for protecting the trench edges and the insulating material from subsequent etching; and an insulating material filling the trench.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

A thinned gate oxide layer at trench edges, particularly sharp trench edges, limits the reliability of the resulting semiconductor device. The trench edges are also vulnerable to field oxide loss during post-gate processing; consequently, junction leakage and/or junction short circuits occur. The present invention enables the manufacture of a semiconductor device without such undesirable consequences.

According to the methodology of an embodiment of the present invention, a photoresist mask is formed directly on a pad oxide layer which, in turn, is formed on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the substrate is etched to form a trench, a thin oxide liner is grown on the side surfaces, bottom and edges of trench, and a polish stop layer is deposited on the oxide liner and the pad oxide layer. The polish stop layer is then masked to the trench edges and anisotropically etched to remove the polish stop from the bottom of the trench, leaving portions on the side surfaces and edges of the trench to serve as protective spacers. The trench is then filled with an insulating material, the insulating material is planarized, as by CMP, and the polish stop is removed by anisotropic etching. Thus, the oxide liner is allowed to grow on the trench edges without the restraint of a polish stop; as a result, the oxide on the trench edges is rounded to improve gate oxide reliability. Furthermore, the protective spacers of polish stop on the side surface and edges of the trench reduce gouging of the field oxide during the LI etch, since the polish stop typically has a low etch rate in the LI etch.

Figure 1A:
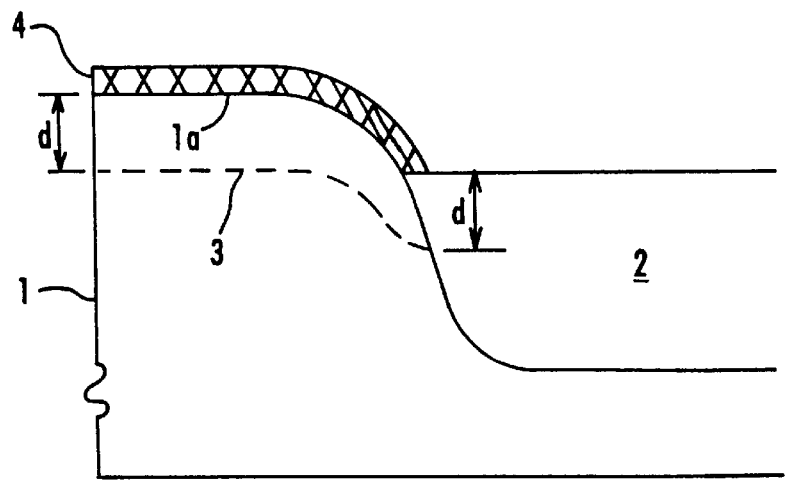
FIGS. 1A and 1B schematically illustrate the trench/substrate interface of a semiconductor device.
Figure 1B:
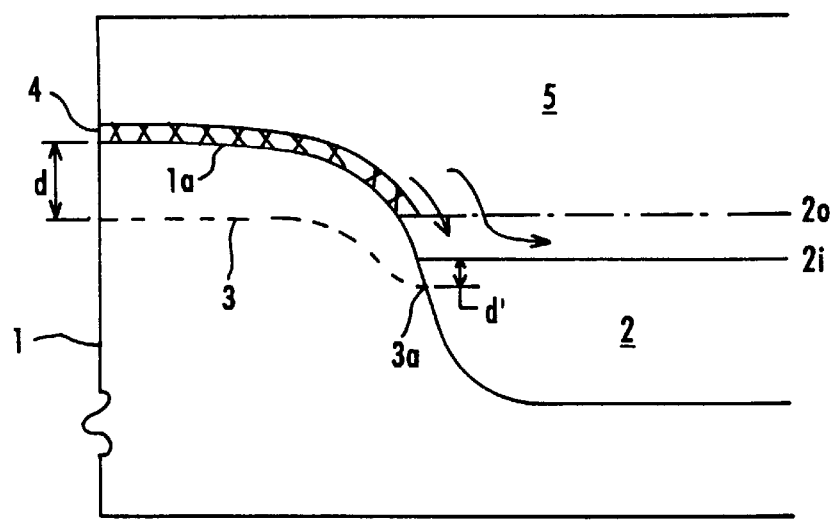
Figure 2A:
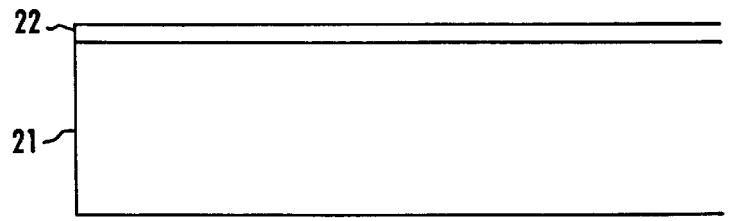
FIGS. 2A–2K schematically illustrate sequential phases of a method in accordance with the present invention.

An embodiment of the present invention is illustrated in FIGS. 2A–2K, wherein sequential phases in forming a semiconductor device in accordance with the present invention are depicted. Referring to FIG. 2A, substrate 21 is prepared with a substantially planar surface, typically a semiconductor substrate comprising doped monocrystalline silicon or an epitaxial layer formed on a semiconductor substrate in accordance with conventional practices. A pad oxide layer 22 is then grown on the substrate 21. Pad oxide layer 22 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer. FIG. 2A illustrates silicon substrate 21 and the pad oxide layer 22.

Figure 2B:
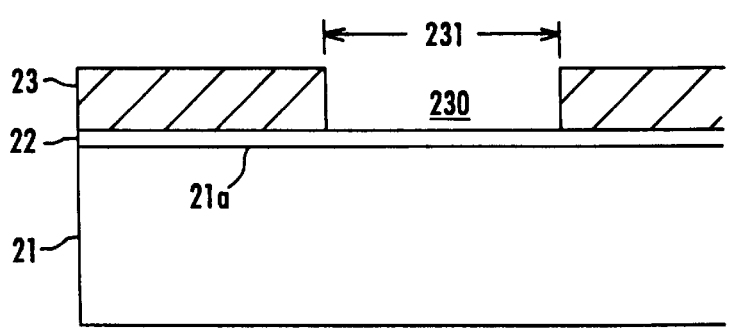
Figure 2C:
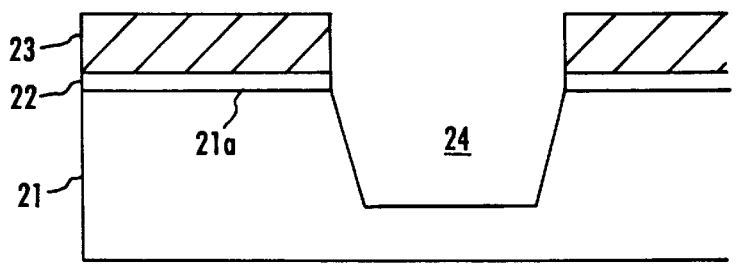

A photoresist mask 23 is then formed on pad oxide layer 22, as shown in FIG. 2B. Photoresist mask 23 has a pattern defined by openings 230, which have a width 231, typically substantially corresponding to the width, at the main surface 21a of substrate 21, of the subsequently formed trench, e.g., about $0.25\mu$ or less. The pad oxide layer 22 is then etched away, and the etching continues into the substrate 21 to form the shallow trench 24, as shown in FIG. 2C. The trench 24 is typically etched to a depth of up to about 4000 Å; e.g., about 2500 Å to about 3000 Å.

Figure 2D:
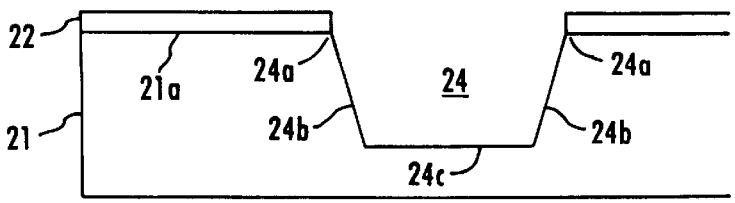
Figure 2E:
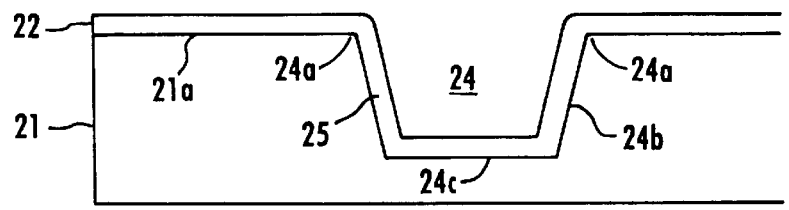

When the etching of the trench 24 is completed, the photoresist 23 is stripped off the pad oxide layer 22, resulting in the trench 24 shown in FIG. 2D, having side surfaces 24b intersecting the main surface 21a of the substrate 21 at edges 24a, and a bottom 24c. Thereafter, the trench surface is thermally oxidized to form an oxide layer 25 lining the trench side surfaces 24b and bottom 24c, on the edges 24a, and in contact with the pad oxide layer 22, typically at a temperature of about 1000° C. FIG. 2E shows the trench 24 with the completed liner 25.

Figure 2F:
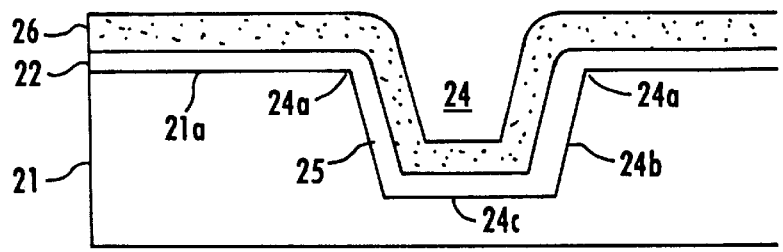
Figure 2G:
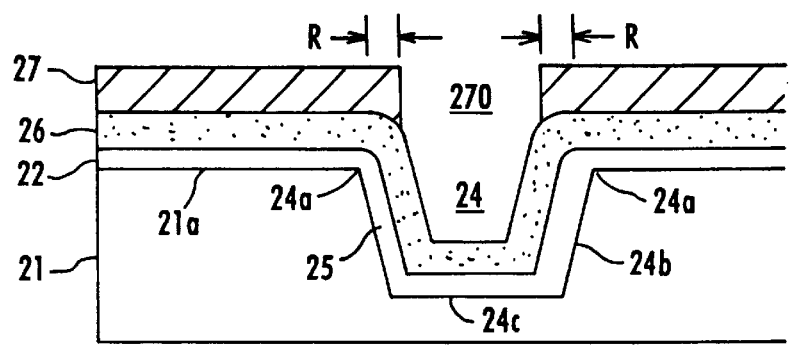

Adverting to FIG. 2F, a polish stop layer 26 is deposited over the oxide liner 25 and the pad oxide layer 22. A photoresist mask 27 is then formed on polish stop layer 26, as shown in FIG. 2G. Photoresist mask 27 extends over the polish stop layer 26 on the trench edges 24a, and has openings 270, which expose the polish stop 26 on the bottom 24c of the trench 24. As depicted in FIG. 2G, the mask 27 can be formed to extend beyond the edges 24a and over the polish stop 26 overlying the side surfaces 24b of the trench 24, or can be formed to leave part or all of this region R exposed, as long as the polish stop 26 overlying the edges 24a is covered by the mask 27.

Figure 2H:
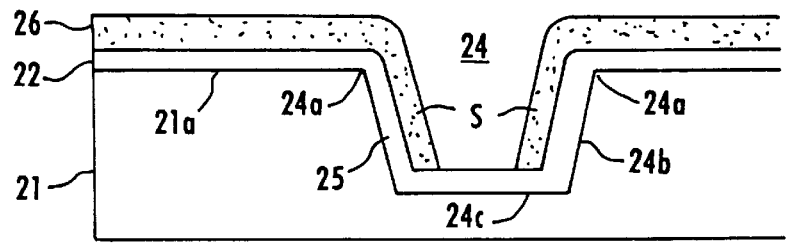

The exposed portions of the polish stop layer 26 are then etched away by anisotropic etching leaving portions S on the side surfaces 24b and edges 24a of the trench 24 which serve as protective spacers. The polish stop layer 26 typically comprises silicon nitride, although any material may be employed that polishes more slowly than the subsequently applied insulating material. FIG. 2H depicts the trench 24 after the polish stop 26 has been etched, and the photoresist mask 27 removed.

Figure 2I:
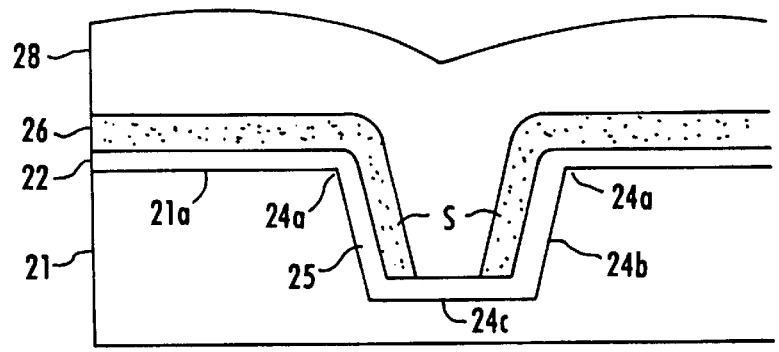
Figure 2J:
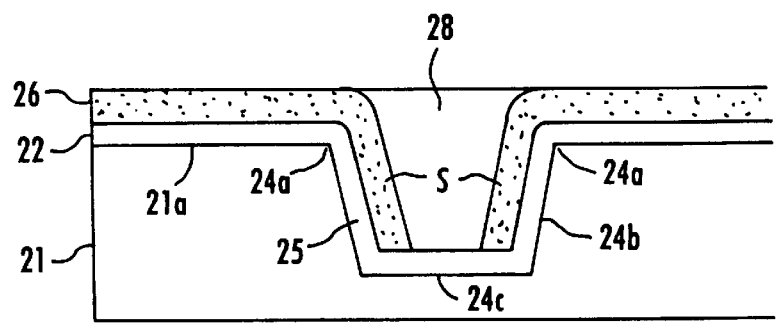
Figure 2K:
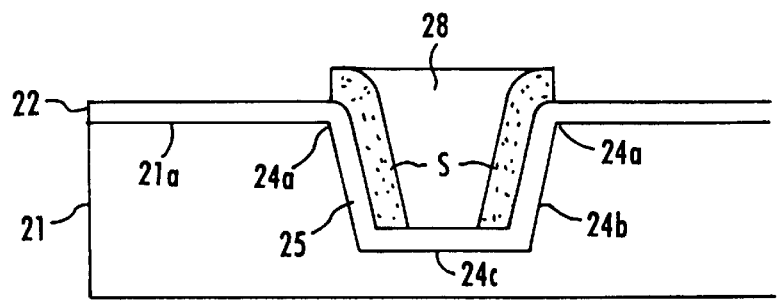

Subsequent to etching of the polish stop layer, trench 24 is filled with a suitable insulating material 28, as shown in FIG. 2I. Such insulating material can comprise silicon dioxide derived from TEOS by LPCVD or derived from silane by LPCVD. The trench 24 can also be filled with a high density plasma (HDP) oxide, preferably employing the methodology disclosed in copending application Ser. No. 08/924,133, filed Sep. 5, 1997 (Attorney Docket No. 1033-352), the entire disclosure of which is hereby incorporated herein by reference. Subsequent to trench filling, planarization is effected, such as by CMP, as shown in FIG. 2J, by polishing the insulating material 28. After polishing, the polish stop layer 26 is removed, preferably by anisotropic etching to preserve the polish stop material of spacer S on the trench edges 24a and yield the structure illustrated in FIG. 2K.

Figure 3:
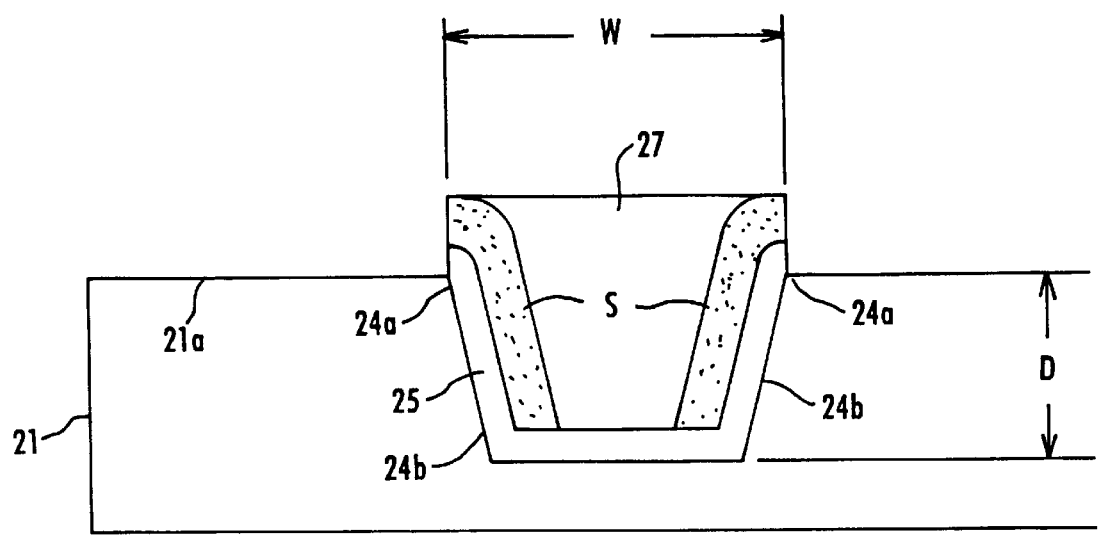
FIG. 3 is a cross-sectional view of a semiconductor device according to the present invention.

An embodiment of a semiconductor device produced according to the present invention is described with reference to FIG. 3. The inventive semiconductor device comprises a trench formed in a main surface 21a of a substrate 21 or in an epitaxial layer formed in substrate 21. The trench has edges 24a where it intersects the main surface 21a, and side surfaces 24b. A silicon dioxide liner 25 is thermally grown on the edges 24a and the side surfaces 24b of the trench, and a silicon nitride protective spacer S is formed on the silicon dioxide liner 25. A silicon dioxide insulating material 27 fills the trench. The trench has a width W of about 0.25 Å or less at the main surface 21a, and a depth D of up to about 4000 Å, and in a preferred embodiment has a depth D of about 2500 Å to about 3000 Å.

The trench isolation formed in accordance with the present invention is characterized by gate oxide layers at the trench edges which are not thinned, but exhibit high quality with an attendant reduction in the electric field between the gate electrode and the substrate at the trench edges. In addition, the protected trench edges are resistant to gouging of the field oxide during post-gate processing, as during the LI etch. The present invention is applicable to the manufacture of various types of semiconductor devices having STI, particularly high density semiconductor devices having a design rule of about $0.25\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an insulated trench formed in a semiconductor substrate or in an epitaxial layer on the semiconductor substrate, which method comprises:

forming a pad oxide layer on a main surface of the substrate or epitaxial layer;

providing a first mask having an opening on the pad oxide layer;

etching to remove portions of the underlying pad oxide layer and to form the trench having a bottom and side surfaces intersecting the main surface at edges;

removing the first mask;

forming an oxide layer lining the trench, on the edges, and in contact with the pad oxide layer;

depositing a polish stop layer on the oxide liner and the pad oxide layer;

providing a second mask on the polish stop layer, the second mask extending over the polish stop layer overlying the trench edges and having an opening exposing the polish stop on the bottom of the trench; and anisotropically etching to remove a portion of the polish stop layer on the bottom of the trench, leaving portions of the polish stop layer on the side surfaces and edges of the trench to serve as protective spacers.

2. The method according to claim 1, wherein the pad oxide layer comprises silicon oxide.

3. The method according to claim 1, wherein the first and second masks comprise photoresist masks.

4. The method according to claim 1, wherein the opening in the first mask has a width substantially equal to a width of the trench at the main surface.

5. The method according to claim 4, wherein the width of the opening is about $0.25\mu$ or under.

6. The method according to claim 5, wherein the trench is etched to a depth of up to about 4000 Å.

7. The method according to claim 6, wherein the trench is etched to a depth of about 2500 Å to about 3000 Å.

8. The method according to claim 2, comprising heating at a temperature of about 1000° C. to thermally grow a silicon oxide layer lining the trench.

9. The method according to claim 8, wherein the silicon oxide liner is formed on the trench edges with a rounded configuration.

10. The method according to claim 1, further comprising filling the trench with insulating material after etching the polish stop layer.

11. The method according to claim 10, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

12. The method according to claim 11, comprising planarizing such that an upper surface of the insulating material is substantially flush with an upper surface of the polish stop layer.

13. The method according to claim 12, comprising planarizing by chemical-mechanical polishing.

14. The method according to claim 12, comprising anisotropically etching the polish stop after planarizing.

15. The method according to claim 1, wherein the polish stop layer comprises silicon nitride.

16. The method according to claim 1, wherein the second photoresist mask extends over the polish stop layer overlying the side surfaces of the trench.

17. A method of manufacturing an integrated circuit on a semiconductor substrate, comprising:

forming a silicon oxide pad layer on a main surface of the substrate or an epitaxial layer formed on the substrate;

providing a first photoresist mask having an opening on the silicon oxide pad layer;

etching to remove portions of the underlying silicon oxide pad layer and to form the trench having a bottom and side surfaces intersecting the main surface at edges;

removing the first mask;

thermally growing a thin silicon oxide layer lining the trench, on the edges and in contact with the silicon oxide pad layer by heating to a temperature of at least about 1000° C., whereby the silicon oxide liner grown on the trench edges is rounded;

depositing a silicon nitride polish stop layer on the silicon oxide liner and the silicon oxide pad layer;

providing a second photoresist mask on the silicon nitride polish stop layer, the second mask extending over the silicon nitride polish stop layer overlying the trench edges and having an opening exposing the silicon nitride polish stop layer on the bottom of the trench;

anisotropically etching to remove a portion of the silicon nitride polish stop layer on the bottom of the trench, leaving portions of the silicon nitride polish stop layer on the side surfaces and edges of the trench to serve as protective spacers;

removing the second mask;

depositing an insulating material to fill the trench and cover the silicon nitride polish stop layer, the insulating material comprising silicon dioxide derived from tetraethyl orthosilicate (TEOS) by low pressure chemical vapor deposition (LPCVD), silicon dioxide derived from silane by LPCVD, or a high density plasma oxide;

planarizing by chemical-mechanical polishing such that an upper surface of the insulating material is substantially flush with an upper surface of the silicon nitride polish stop layer; and anisotropically etching the silicon nitride polish stop layer.

* * * * *